United States Patent
Shubin et al.

(10) Patent No.: US 9,698,564 B1
(45) Date of Patent: Jul. 4, 2017

(54) HYBRID INTEGRATED MCM WITH WAVEGUIDE-FIBER CONNECTOR

(71) Applicant: Oracle International Corporation, Redwood Shores, CA (US)

(72) Inventors: Ivan Shubin, San Diego, CA (US); Xuezhe Zheng, San Diego, CA (US); Jin-Hyoung Lee, San Diego, CA (US); Ashok V. Krishnamoorthy, San Diego, CA (US)

(73) Assignee: ORACLE INTERNATIONAL CORPORATION, Redwood Shores, CA (US)

(*) Notice: Subject to any disclaimer, the term of this patent is extended or adjusted under 35 U.S.C. 154(b) by 0 days.

(21) Appl. No.: 15/019,631

(22) Filed: Feb. 9, 2016

(51) Int. Cl.
*G02B 6/12* (2006.01)
*H01S 5/026* (2006.01)
*G02B 6/30* (2006.01)
*G02B 6/42* (2006.01)
*H01S 5/10* (2006.01)
*H01S 5/02* (2006.01)
*H01S 5/30* (2006.01)

(52) U.S. Cl.
CPC ............ *H01S 5/026* (2013.01); *G02B 6/30* (2013.01); *G02B 6/4292* (2013.01); *H01S 5/0206* (2013.01); *H01S 5/1014* (2013.01); *H01S 5/3013* (2013.01)

(58) Field of Classification Search
None
See application file for complete search history.

(56) References Cited

U.S. PATENT DOCUMENTS

| | | | | |
|---|---|---|---|---|
| 5,432,878 A | * | 7/1995 | Smous | G02B 6/4236 385/129 |
| 6,169,833 B1 | * | 1/2001 | Goossen | G02B 6/423 385/14 |

(Continued)

OTHER PUBLICATIONS

A.J. Zilkie, "Power-efficient III-V/Silicon external cavity DBR lasers", Optics Express, Oct. 8, 2012, vol. 20, No. 21.

(Continued)

*Primary Examiner* — Rhonda Peace
(74) *Attorney, Agent, or Firm* — Park, Vaughan, Fleming & Dowler LLP

(57) ABSTRACT

A multi-chip module (MCM) includes: an interposer, a photonic chip, an optical gain chip, and a waveguide-fiber connector. The photonic chip, which may be electrically coupled to the interposer, may be implemented using a silicon-on-insulator (SOI) technology, and may include an optical waveguide that conveys an optical signal. Moreover, the optical gain chip, which may be electrically coupled to the interposer, may include a III-V compound semiconductor, and may include a second optical waveguide that conveys the optical signal and that is vertically aligned with the optical waveguide relative to a top surface of the interposer. Furthermore, the waveguide-fiber connector may be mechanically coupled to the interposer, and remateably mechanically coupled to an optical fiber coupler that includes the optical fiber. The waveguide-fiber connector may convey the optical signal between the optical waveguide in the photonic chip and the optical fiber.

18 Claims, 7 Drawing Sheets

(56) References Cited

U.S. PATENT DOCUMENTS

| | | | | |
|---|---|---|---|---|
| 6,228,670 | B1* | 5/2001 | Kudo | G02B 6/12004 438/31 |
| 6,356,692 | B1* | 3/2002 | Ido | G02B 6/12007 385/129 |
| 8,275,013 | B2* | 9/2012 | Bessho | H01S 5/4043 372/36 |
| 8,742,576 | B2* | 6/2014 | Thacker | H01L 24/72 174/250 |
| 8,755,655 | B2* | 6/2014 | Krishnamoorthy | G02B 6/12 385/14 |
| 8,971,676 | B1* | 3/2015 | Thacker | G02B 6/12 385/14 |
| 9,470,855 | B1* | 10/2016 | Shubin | G02B 6/4228 |
| 9,519,105 | B1* | 12/2016 | Shubin | G02B 6/4228 |
| 2002/0037025 | A1* | 3/2002 | Bartman | H01S 5/141 372/50.11 |
| 2003/0151121 | A1* | 8/2003 | Kuhara | G02B 6/4292 257/666 |
| 2004/0057653 | A1* | 3/2004 | Fukuda | G02B 6/124 385/14 |
| 2006/0002443 | A1* | 1/2006 | Farber | H01S 5/141 372/50.1 |
| 2010/0208756 | A1* | 8/2010 | Noh | G02B 6/4206 372/20 |
| 2013/0209112 | A1* | 8/2013 | Witzens | G02B 6/2813 398/214 |
| 2014/0185980 | A1* | 7/2014 | Lei | G02B 6/12004 385/14 |
| 2015/0117812 | A1* | 4/2015 | Brooks | G02B 6/4225 385/14 |

OTHER PUBLICATIONS

Jin Hyoung Lee, "High power and widely tunable Si hybrid external-cavity laser for power efficient Si photonics WDM links", Optics Express, Apr. 7, 2014, vol. 22, No. 7.

T. Shoji, "Low loss mode size converter from 0.3um square Si wire waveguides to singlemode fibres", Electronics Letters, Dec. 5, 2002, vol. 38, No. 25.

ozOptics, "V-Groove Chips", http://www.ozoptics.com/ALLNEW_PDF/DTS0077.pdf, Mar. 31, 2009.

Moritex Corporation, "Optical fiber arrays, V-grooves", http://moritex.com/products/optocom/optical/optical_telecom_components/6-1-1-8.html, downloaded Dec. 14, 2015.

Optoscribe, "The FCX Fiber Coupled InterconneX—ideal for fiber connection in telecommunications", http://www.optoscribe.com/products/fcx-fiber-coupled-interconnex/, downloaded Dec. 14, 2015.

8. http://www.usconec.com/images/drawings/C14620.pdf, Feb. 22, 2012.

* cited by examiner

HYBRID INTEGRATED MCM WITH WAVEGUIDE-FIBER CONNECTOR

U.S. GOVERNMENT LICENSE RIGHTS

This invention was made with U.S. government support under Agreement No. HR0011-08-9-0001 awarded by DARPA. The U.S. government has certain rights in the invention.

BACKGROUND

Field

The present disclosure generally relates to multi-chip modules (MCMs) and techniques for fabricating MCMs. More specifically, the present disclosure relates to an MCM that includes an interposer, a photonic chip, an optical gain chip and a waveguide-fiber connector.

Related Art

Optical interconnects based on silicon-photonics technology have the potential to outperform electrical interconnects in terms of bandwidth, component density, energy efficiency, latency, and physical reach. Consequently, optical interconnects are a promising solution to alleviate inter-chip and intra-chip communication bottlenecks in high-performance computing systems.

While tremendous progress has been made in developing silicon-on-insulator (SOI) circuits, light sources on silicon remain a substantial technological challenge. In particular, in order to make an efficient laser source on silicon, an efficient optical gain medium is needed. However, because of its indirect bandgap structure, silicon is usually a poor material for light emission. Although there are ongoing efforts to enhance the light-emitting efficiency and optical gain in silicon, an electrically pumped room-temperature continuous-wave (CW) laser in silicon remains elusive. Similarly, while there have been exciting developments in the use of germanium directly grown on silicon as the optical gain medium, high-tensile strain and high doping are typically needed for germanium to have a direct bandgap, which usually results in low laser efficiency. Furthermore, epitaxial growth of III-V compound semiconductors on silicon is often difficult because of the large lattice and thermal mismatches between silicon and the III-V compound semiconductors, which also limits laser efficiency and reliability. Thus, because of a number of material, process and device physics issues, these areas remain research topics.

An alternative near-term approach for building lasers on or using silicon is hybrid wafer integration of III-V compound semiconductors with silicon. For example, evanescent-coupled hybrid lasers have been successfully demonstrated by wafer bonding of indium-phosphide active structures to silicon via either oxide-to-oxide fusion bonding or polymer-enabled benzocyclobutene bonding. However, because of taper loss, carrier-injection efficiency and thermal impedance, these hybrid lasers typically have relatively low optical-waveguide-coupled overall efficiency. Furthermore, wafer-bonding approaches usually only work for direct bonding of III-V compound semiconductors on a silicon wafer with passive circuits. In addition, III-V compound-semiconductor wafers and SOI wafers often do not have compatible sizes. In particular, a III-V compound-semiconductor wafer size is usually limited to 150 mm, while typical SOI photonic wafer diameters are 200 mm and 300 mm. Consequently, integrating hybrid laser sources with other active silicon devices (which may include multiple layers of metal interconnects and interlayer dielectrics) remains a challenge.

Edge-to-edge butt-coupling of a III-V compound-semiconductor optical gain medium with silicon optical waveguides is a common hybrid integration approach. It allows the high electrical injection efficiency and low thermal impedance of conventional III-V compound-semiconductor lasers to be maintained. Moreover, using this approach, both the III-V compound-semiconductor optical gain media and the SOI circuits can be independently optimized for performance, and can be independently fabricated. External cavity (EC) lasers using this hybrid integration technique have been successfully demonstrated with high optical-waveguide-coupled overall efficiencies. However, because of the optical-mode mismatch between the III-V compound-semiconductor and the silicon optical waveguides, special mode size converters on either or both sides of the III-V compound semiconductor and silicon are often needed. In addition, in order to obtain efficient optical coupling, accurate alignment of the optical waveguides in the III-V compound semiconductor and the silicon with sub-micron alignment tolerances is typically needed. Addressing these problems can decrease the yield and increase the cost of these hybrid lasers.

Hence, what is needed is a multi-chip module (MCM) and a technique for fabricating an MCM without the problems described above.

SUMMARY

One embodiment of the present disclosure provides a multi-chip module (MCM). This MCM includes: an interposer having a top surface, a photonic chip, an optical gain chip, and a waveguide-fiber connector. The photonic chip includes: a substrate; a buried-oxide (BOX) layer disposed on the substrate; and a semiconductor layer disposed on the buried-oxide layer, where an optical waveguide is defined in the BOX layer and the semiconductor layer. Moreover, traces, disposed on the semiconductor layer, face and are electrically coupled to the top surface of the interposer. Furthermore, the optical gain chip includes a second optical waveguide defined in the second substrate, where a location of the second optical waveguide is vertically aligned with a location of the optical waveguide relative to the top surface of the interposer, and the second substrate faces and is electrically coupled to the top surface of the interposer. Additionally, the waveguide-fiber connector is mechanically coupled to the top surface of the interposer. The waveguide-fiber connector has a first end configured to remateably mechanically couple to an optical fiber coupler and a second end, where the waveguide-fiber connector includes a third optical waveguide that optically couples the first end and the second end and, at the second end, a location of the third optical waveguide is vertically aligned with a location of the optical waveguide relative to the top surface of the interposer.

Note that the optical fiber coupler may include an optical fiber and, at the first end, a location of the third optical waveguide is vertically aligned with a location of an optical fiber included in the optical fiber coupler. In some embodiments, the waveguide-fiber connector includes a ferrule for the optical fiber in the optical fiber coupler.

Moreover, the optical fiber may be located at a first vertical position relative to the top surface of the interposer and the optical waveguide may be located at a second, different vertical position relative to the top surface of the interposer, where the third optical waveguide may have a three-dimensional form. During operation, the third optical waveguide may convey an optical signal between the first vertical position and the second vertical position.

Furthermore, the waveguide-fiber connector may include a material compatible with a reflow temperature exceeding a predefined threshold. Additionally, the waveguide-fiber connector may include mechanical alignment features configured to mate with corresponding mechanical alignment features in the optical fiber coupler.

In some embodiments, the optical gain chip includes an optical spot-size converter. During operation, the optical gain chip may transition a spot size of an optical mode in the optical waveguide to a second spot size of a second optical mode in the second optical waveguide.

Moreover, the second substrate may include a semiconductor other than silicon. For example, the second substrate may include a III-V compound semiconductor. Note that the optical gain chip may be: a semiconductor optical amplifier; and/or a laser.

Furthermore, the substrate, the BOX layer and the semiconductor layer may constitute a silicon-on-insulator technology.

Another embodiment provides a system that includes: a processor; a memory, coupled to the processor, which stores a program module; and the MCM. During operation, the program module is executed by the processor.

Another embodiment provides a method for outputting an optical signal using the MCM.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same type of part are designated by a common prefix separated from an instance number by a dash.

DETAILED DESCRIPTION

Figure 1:
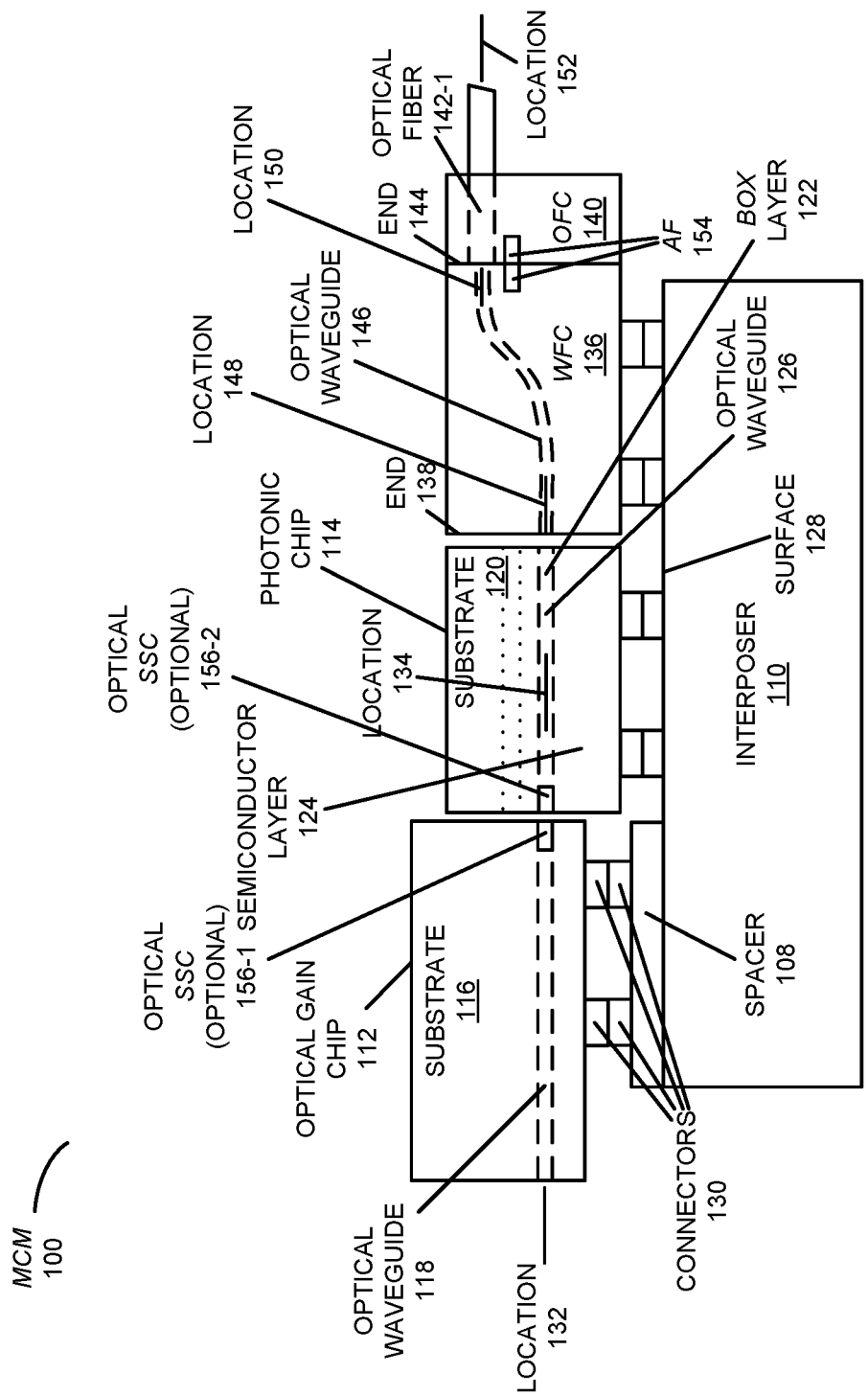
FIG. 1 is a diagram illustrating a side view of a multi-chip module (MCM) in accordance with an embodiment of the present disclosure.

Embodiments of a multi-chip module (MCM), a system that includes the MCM, and a technique for outputting an optical signal using the MCM are described. This MCM includes: an interposer, a photonic chip, an optical gain chip, and a waveguide-fiber connector. The photonic chip, which may be electrically coupled to the interposer, may be implemented using a silicon-on-insulator (SOI) technology, and may include an optical waveguide that conveys an optical signal. Moreover, the optical gain chip, which may be electrically coupled to the interposer, may include a III-V compound semiconductor, and may include a second optical waveguide that conveys the optical signal and that is vertically aligned with the optical waveguide relative to a top surface of the interposer. Furthermore, the waveguide-fiber connector may be mechanically coupled to the interposer, and remateably mechanically coupled to an optical fiber coupler that includes the optical fiber. The waveguide-fiber connector may convey the optical signal between the optical waveguide in the photonic chip and the optical fiber.

In this way, the MCM may provide low-cost co-planar integration of the optical gain chip and the photonic chip (or wafer) using edge coupling to form a co-planar hybrid platform. The MCM may provide internal light generation and photonic on-chip processing by permanent active substrates, and it may be enabled by high-precision flip-chip bonding systems (e.g., with $\Delta x$, $\Delta y$ equal to $\pm 0.5$ μm). Moreover, the MCM may provide fully functional light-emitting optical transceivers that: are compact, have low power consumption, operate at high bandwidth, and are scalable into large-array systems and links. Consequently, the MCM may enable high efficiency and performance of chip-to-chip and board-to-board optical interconnects.

We now describe embodiments of an MCM. Low-loss edge coupling of III-V compound-semiconductor optical waveguides with silicon or silicon-on-insulator (SOI) optical waveguides usually involves: optical mode matching, a high-surface quality coupling edge, and accurate optical waveguide alignment. A typical III-V compound-semiconductor optical waveguide has an optical mode size around 1 μm in diameter vertically, which matches neither one of the two popular SOI platforms for silicon photonics, 0.25 to 0.3 μm SOI and 3 μm SOI. Spot-size converters (SSCs) are usually needed on the side with a smaller optical mode size to up-convert the optical mode size to match the other side with the larger optical mode size. In order to integrate a III-V compound-semiconductor active gain medium with a 0.25 to 0.3 μm SOI platform, SSCs are, therefore, typically needed on the SOI side. Moreover, in order to expand the optical mode both laterally and vertically, an SSC using an inverse silicon optical waveguide taper followed with a larger dielectric optical waveguide with a lower index-of-refraction contrast may be used.

Moreover, in order to obtain coupling edges with good surface quality, cleaving or dicing, polishing and/or reactive-ion etching are often used, which forces integration to be performed on a chip-by-chip basis (either on the chip or wafer). Furthermore, III-V compound-semiconductor optical gain chips and their optical waveguides are typically cleaved in order to obtain optical access. This cleaving typically results in high-quality facets.

The MCM described herein may integrate two or more types of chips into a single functional, hybrid-integrated photonic module or transceiver with internally generated laser light (and, more generally, an optical signal). In particular, the MCM may include: a III-V compound-semiconductor optical gain chip or optical gain medium chip (such as an optical gain medium chip implemented on an indium phosphide substrate); an external laser cavity SOI photonic chip with or without light-modulating circuits on the silicon substrate; and a waveguide-fiber connector (which may be fabricated using glass, such as photosensitive glass) to optically couple the photonic chip and an optical fiber. In some embodiments, the MCM includes an optional data-modulating and laser-driving VLSI chip on a silicon substrate that is electrically coupled with the photonic chip and/or the optical gain chip. However, in other embodiments the functionality of the optional data-modulating and laser-driving VLSI chip is included in the photonic chip. All three of these chips may be manufactured with different processing technologies, which may not be compatible with each other.

The disclosed embodiments of the MCM may be assembled using high-precision flip-chip bonding equipment by: passively aligning and securing the chips based on their alignment features on applicable interfaces or surfaces; and/or actively aligning chips to each other. For example, the chips may be aligned while the secured and electrically connected light source (e.g., the optical gain chip) is powered on, and adapting or changing the position of the photonic chip and/or the waveguide-fiber connector to optimize the detected coupled light or the optical signal. The flip-chip bonding equipment may align the optical waveguides in the chips with high and sufficient accuracy (such as ±0.5 µm) to ensure a uniform bondline with respect to the interposer and/or the optional VLSI driver chip. This may be accomplished by first bonding the optical gain chip to the electrically active interposer while ensuring electrical connectivity to the chips bonded to it. Then, the optical gain chip may be powered up via the interposer to generate the optical signal. Next, the photonic chip may be brought into immediate edge contact (a so-called 'active edge' where light is either exiting or entering) with the edge of the optical gain chip and the optical signal is coupled into the optical waveguide(s) in the photonic chip. Similar operations may be performed with the waveguide-fiber connector and the photonic chip.

Note that the photonic chip and/or the waveguide-fiber connector may have fixed or temporary electrical connectivity to allow the coupled light to be detected and measured externally, so that the position with the highest detected optical signal can be determined. Moreover, note that the MCM may be fabricated using individual chips or in wafer-scale integration. Furthermore, a permanent adhesive (such as epoxy) may be used in order to secure the aligned assembly.

FIG. 1 presents a diagram illustrating a side view of an MCM 100. This MCM includes an interposer 110, an optical gain chip 112 and a photonic chip 114. For example, optical gain chip 112 may include a substrate 116 that includes a III-V compound-semiconductor and an optical waveguide 118. In an exemplary embodiment, optical gain chip 112 is a semiconductor optical amplifier and/or a laser. Furthermore, photonic chip 114 may be an SOI photonic chip. Therefore, photonic chip 114 may include: silicon substrate 120; a buried-oxide layer (BOX) 122 disposed on silicon substrate 120; and a semiconductor (silicon) layer 124 disposed on buried-oxide layer 122, where another optical waveguide 126 is defined in semiconductor layer 124. Note that photonic chip 114 may: provide optical feedback to optical gain chip 112; control and stabilize power/current delivery to optical gain chip 112; control and stabilize the operating laser wavelength; data-modulate the out-coming optical stream; and/or receive optical signals and encode data.

Moreover, optical gain chip 112 and photonic chip 114 may be disposed on a top surface 128 of interposer 110, which is electrically coupled to optical gain chip 112 and photonic chip 114 by a matching set of electrical pads or connectors 130. For example, traces disposed on semiconductor layer 124 (i.e., on a top surface of photonic chip 114) may face and may be electrically coupled to top surface 128 of interposer 110. In addition, a top surface of optical gain chip 112 may be electrically coupled to top surface 128 of interposer 110. The matching set of electrical pads or connectors 130 may power up and provide data to the photonic chip 114, and may drive current through optical gain chip 112.

Note that a location 132 (relative to top surface 128) of optical waveguide 118 may be vertically aligned with a location 134 of optical waveguide 126 (relative to top surface 128). For example, top surfaces of one or more of interposer 110, optical gain chip 112 and photonic chip 114 may include one or more optical-waveguide leveling spacers or spacer layers (such as spacer 108). The optical-waveguide leveling spacers may be located on one chip and/or the other in MCM 100 depending on the vertical positions of their optical modes and the fabrication technology used to fabricate components in MCM 100. Moreover, the optical-waveguide leveling spacers may have appropriate thickness (equal to a difference between the heights or thicknesses of optical gain chip 112 and photonic chip 114) to facilitate the vertical alignment. In some embodiments, the one or more optical-waveguide leveling spacers include: a metal, a polymer and/or a resin.

In this way, optical gain chip 112 and photonic chip 114 may be brought into complete six-axis alignment and optically coupled. In some embodiments, optical gain chip 112 and/or photonic chip 114 include one or more optional optical spot-size converters (SSCs) 156 that, during operation, transition a spot size of an optical mode in optical waveguide 118 (e.g., by expanding the optical mode laterally and/or vertically) to a spot size of an optical mode in optical waveguide 126 (and vice versa).

Furthermore, MCM 100 may include waveguide-fiber connector (WFC) 136, mechanically coupled to top surface 128 of interposer 110, having an end 138 configured to remateably mechanically couple to optical fiber coupler or assembly (OFC) 140 (which includes an optical fiber 142-1, such as a single-mode optical fiber) and an end 144. This may allow optical fiber 142-1 to be easily and accurately mechanically and optically coupled to MCM 100. For example, waveguide-fiber connector 136 may include an optical waveguide 146 that optically couples ends 138 and 144 (and that, during operation, conveys the optical signal between ends 138 and 144). Additionally, a location 148 of optical waveguide 146 may be vertically aligned with a location 134 of optical waveguide 118 (relative to surface 128), and a location 150 of optical waveguide 146 may be vertically aligned with a location 152 of optical fiber 142-1. In particular, optical waveguide 146 may have a three-dimensional form with a varying vertical position (relative to surface 128) and, therefore, locations 148 and 150 may be at different vertical positions. By including waveguide-fiber connector 136, MCM 100 may simplify optical coupling between photonic chip 114 and optical fiber 142-1.

In some embodiments, waveguide-fiber connector 136 includes a ferrule (such as an MT ferrule) for optical fiber 142-1 in optical fiber coupler 140. Moreover, waveguide-fiber connector 136 may include a material compatible with a reflow temperature exceeding a predefined threshold (such as 250 C). This may allow further thermal processing of MCM 100 without damaging waveguide-fiber connector 136. Furthermore, waveguide-fiber connector 136 may include mechanical alignment features (AF) 154 that mate with corresponding mechanical alignment features 154 (such as corresponding positive and negative alignment features, e.g., keys or pins and slots or holes) in optical fiber coupler 140, which may facilitate alignment and, thus, optical coupling in MCM 100.

Note that assembly of an MCM may be complicated by the need to use pre-tested parts (so-called 'known good die') in order to maximize the overall packaging yield. However, as the number of die increases in the MCM, the risk of failure grows accordingly. The optical module of the transceiver in the embodiments of the MCM (which includes optical gain chip 112 and photonic chip 114) can only be tested after all optical and electrical chips have been bonded together powering it all up. It may be advantageous to first build, test, and validate an optical component in the transceiver prior to committing this part to flip-chip assembly with its already-validated optional VLSI driver chip.

Interposer 110 may provide this capability. In particular, interposer 110 may provide a platform for optical gain chip 112 and photonic chip 114. Moreover, a passive interposer can be fabricated with somewhat relaxed fabrication tolerances (relative to VLSI and SOI processes) without active semiconductor elements. Furthermore, interposer 110 may provide: the optical-waveguide leveling spacers to vertically align components in MCM 100; electrical interconnects matching those of optical gain chip 112 and photonic chip 114; low-propagation-loss metal traces to provide high-fidelity data signaling at low power to photonic chip 114; mechanical strength; and/or additional options to thermally manage optical gain chip 112 and photonic chip 114.

Note that multiple optical channels can be simultaneously created by coupling arrays of optical outputs from optical gain chip 112 into arrays of (optical spot-size-converter enabled) inputs of photonic chip 114. Thus, in MCM 100, there may be multiple instances of optical waveguides in optical gain chip 112, photonic chip 114 and waveguide-fiber connector 136. These optical waveguides may be routed with different pitches on the input and output interfaces, and their optical mode size can also be tailored to effectively match the optical waveguide modes of the mated devices, e.g., the optical modes of the SOI-tapered optical waveguides on one side and single-mode optical fibers on the other.

In another embodiment, the MCM leverages the planar leveling provided by the interposer. In particular, the interposer may include micro-machined features that facilitate alignment and optical coupling to one or more optical fibers. For example, the micro-machined features may include V-shaped grooves (i.e., elongated, triangular trenches), which are integrated onto the interposer to facilitate accurate passive placement of single-mode optical fibers so that their optical cores are aligned with the optical waveguides in the photonic chips, thereby providing a light conduit in to and out of the MCM.

The V-shaped grooves can be implemented in crystalline silicon using processing techniques, such as by using a silicon nitride hard mask and wet etching, with appropriate dimensions and orientation, and with sub-micron accuracies. For example, V-shaped grooves may be formed on a <100> oriented silicon substrate along the <110> direction. In hydroxide chemistries (such as potassium hydroxide or tetramethylammonium hydroxide), silicon etches anisotropically and forms pyramidal pits bounded by <111> planes that are angled at 54.7° relative to the <100> surface plane. An optical fiber having a diameter of 125 μm diameter can be housed in the resulting V-shaped groove. In embodiments where there are multiple optical fibers, the V-shaped grooves have a pitch that is almost as tight as the diameter of the optical fibers.

Figure 2:
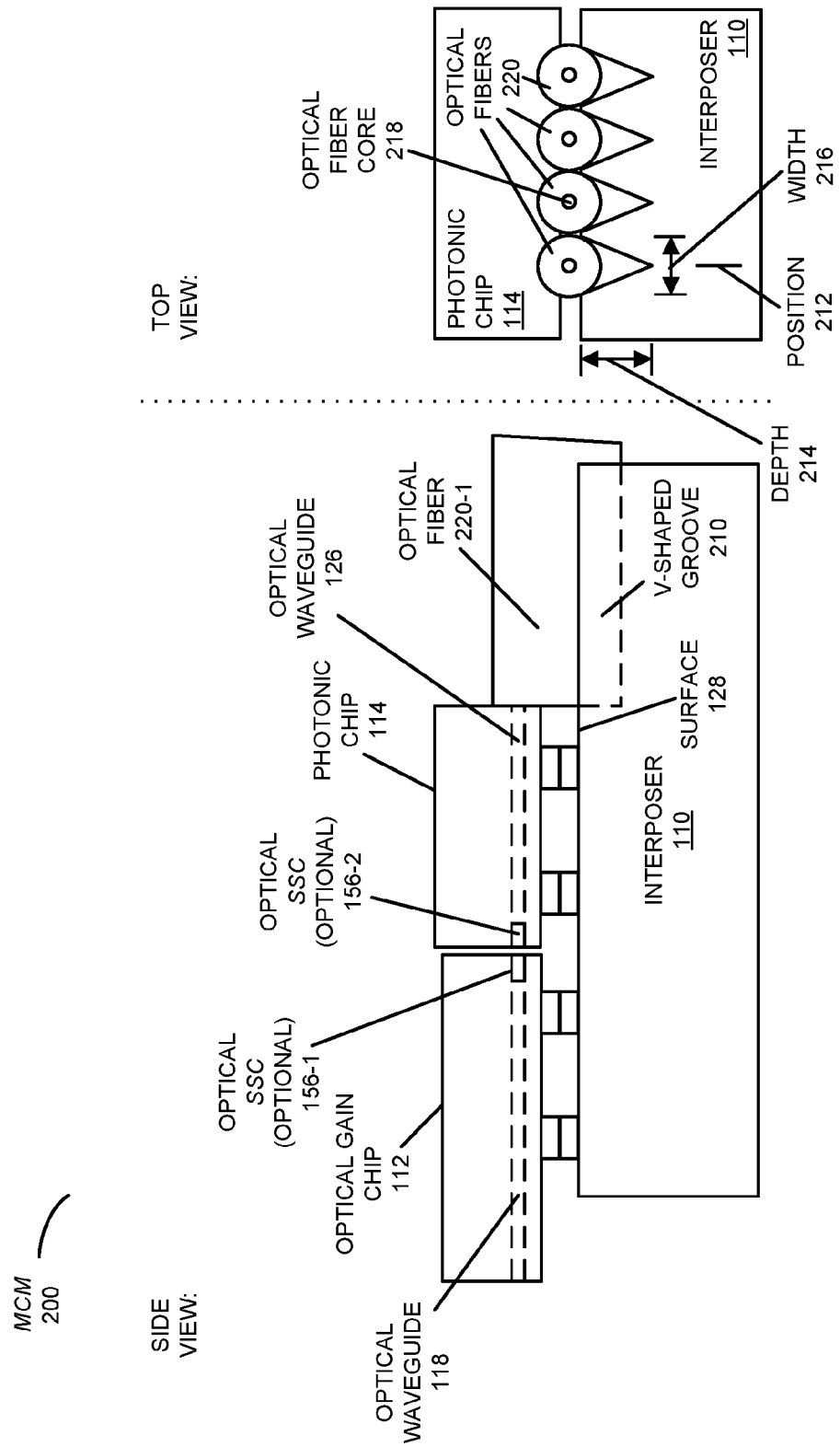
FIG. 2 is a diagram illustrating a side view and an edge view of an MCM in accordance with an embodiment of the present disclosure.

FIG. 2 presents a diagram illustrating a side view and an edge view of an MCM 200. This MCM includes instances of V-shaped grooves (such as V-shaped groove 210) on interposer 110. Positions (such as position 212), etch depth 214 and width 216 of the instances of V-shaped grooves may be calculated and processed to allow for optical fiber cores (such as optical fiber core 218) to line up with the output SOI optical waveguide tapers (or optical spot-size converters) as they are lowered into the V-shaped grooves and secured. After removing optical fibers 220 from their housing or assembly, optical fibers 220 can be placed into their V-shaped grooves one at a time or as a group on a previously assembled block. These optical fibers may be secured in the V-shaped grooves using an adhesive. Moreover, optical fibers 220 may be placed and butted against a facet of photonic chip 114 in order to minimize their physical separation.

Figure 3:
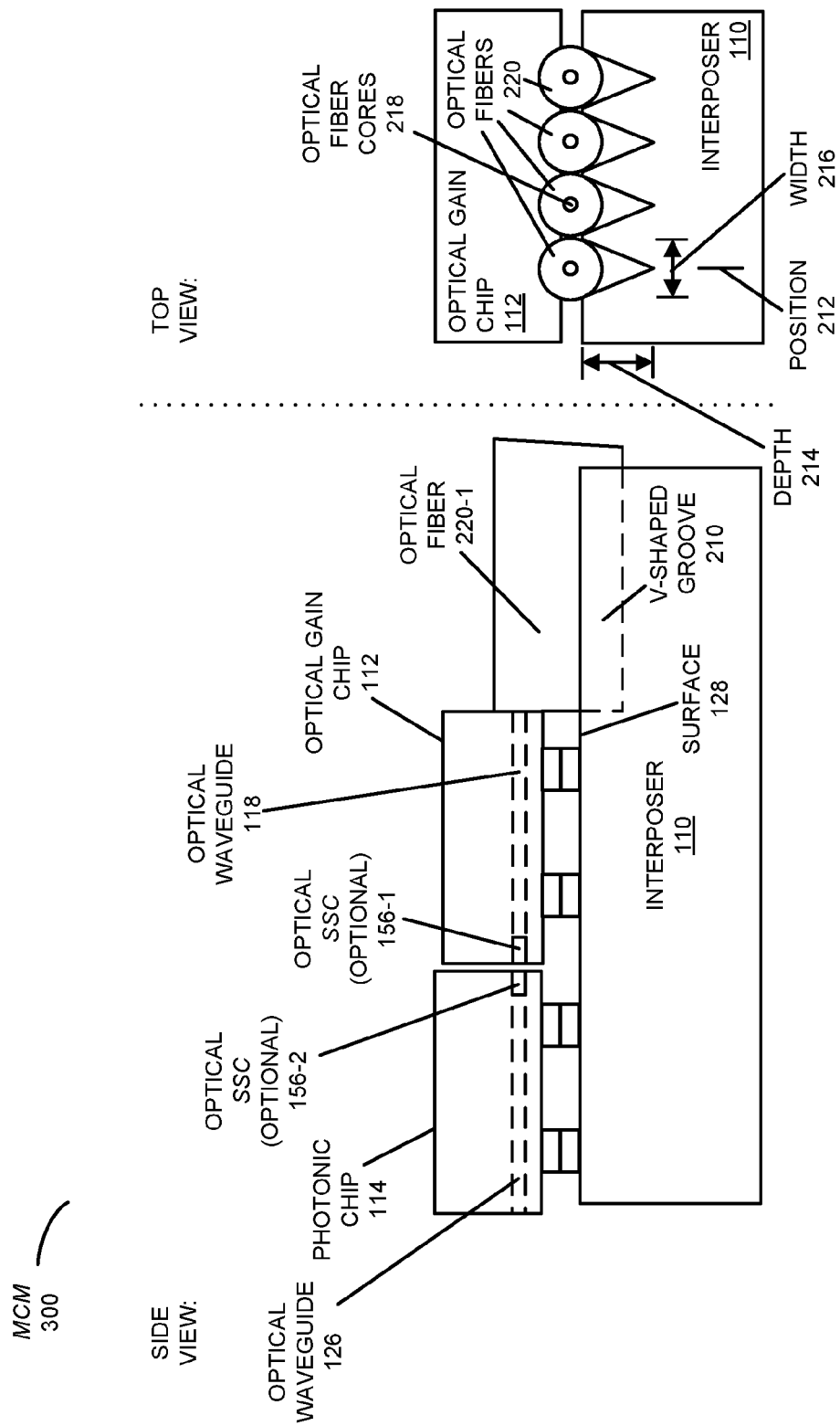
FIG. 3 is a diagram illustrating a side view of an MCM in accordance with an embodiment of the present disclosure.

In some embodiments, the relative positions of optical gain chip 112 and photonic chip 114 are reversed. This is shown in FIG. 3, which presents a diagram illustrating a side view of an MCM 300. In this case, light output is drawn directly from optical gain chip 112 while photonic chip 114 provides optical reflection (feedback), power monitoring and wavelength tuning. This is an example of an optical fiber-pigtailed laser with an external cavity.

Figure 4:
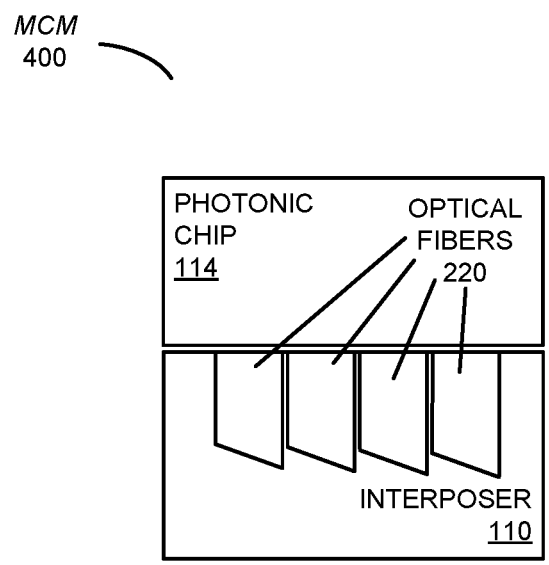
FIG. 4 is a diagram illustrating a top view of an MCM in accordance with an embodiment of the present disclosure.
Figure 5:
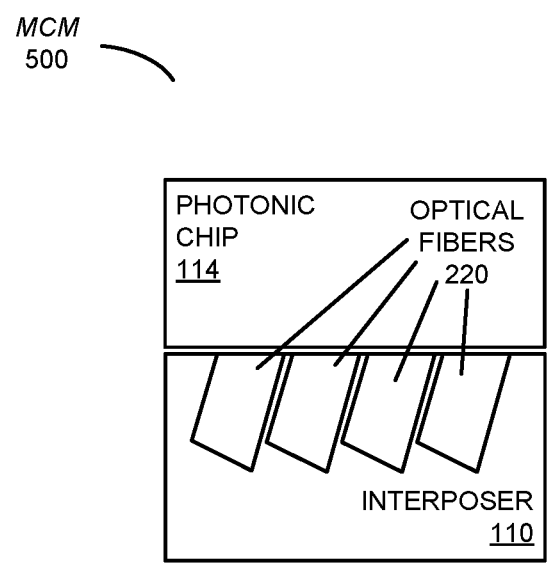
FIG. 5 is a diagram illustrating a top view of an MCM in accordance with an embodiment of the present disclosure.

In FIGS. 3 and 4, the V-shaped grooves can be fabricated on interposer 110 with either cleaved optical fibers 220 approaching the chip facet normally (as shown in FIG. 4, which presents a diagram illustrating a top view of an MCM 400) or at an angle (as shown in FIG. 5, which presents a diagram illustrating a top view of an MCM 500) in order to minimize reflections at the coupling interface based on the Brewster's angle. For example, the angle may be 18-27°.

The packaging technique may use an interposer that combines electrical, physical and thermal features along with either micro-machined V-shaped grooves or a glass-made waveguide-fiber connector or adapter. The V-shaped grooves may be designed to accommodate and align (any) optical fibers with on-chip optical waveguides in the aligned and powered-up chips in the MCM, thereby providing a passive packaging solution with an external optical output. Moreover, the waveguide-fiber connector may match optical modes of the optical waveguides on the SOI photonic chip to the optical modes of the optical fibers, and may fan out arrays of optical waveguides from the input with an initial pitch and locations to the corresponding output pitch and positions. This interposer may facilitate a versatile platform for an optical fiber-pigtailed multi-channel optoelectronic module that provides a laser source and/or high-speed optical transceiver.

Figure 6:
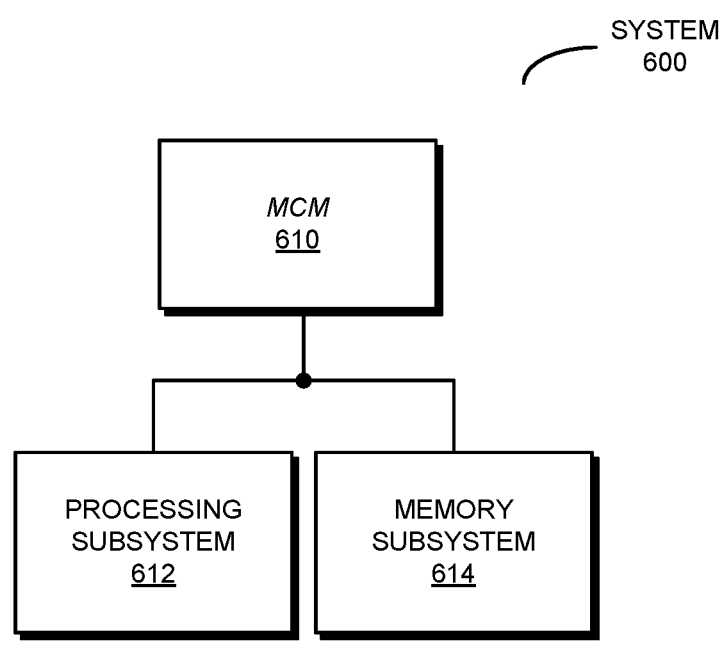
FIG. 6 is a block diagram illustrating a system in accordance with an embodiment of the present disclosure.

One or more of the preceding embodiments of the MCM may be included in a system and/or an electronic device. This is shown in FIG. 6, which presents a block diagram illustrating a system 600 that includes MCM 610, such as one of the preceding embodiments of the MCM. In some embodiments, system 600 includes processing subsystem 612 (with one or more processors) and memory subsystem 614 (with memory).

In general, functions of MCM 610 and system 600 may be implemented in hardware and/or in software. Thus, system 600 may include one or more program modules or sets of instructions stored in a memory subsystem 614 (such as DRAM or another type of volatile or non-volatile computer-readable memory), which, during operation, may be executed by a processing subsystem 612. Note that the one or more computer programs may constitute a computer-program mechanism. Furthermore, instructions in the various modules in memory subsystem 614 may be implemented in: a high-level procedural language, an object-oriented programming language, and/or in an assembly or machine language. Note that the programming language may be compiled or interpreted, e.g., configurable or configured, to be executed by the processing subsystem.

Components in system 600 may be coupled by signal lines, links or buses. These connections may include electrical, optical, or electro-optical communication of signals and/or data. Furthermore, in the preceding embodiments, some components are shown directly connected to one another, while others are shown connected via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 600 may be at one location or may be distributed over multiple, geographically dispersed locations.

System 600 may include: a VLSI circuit, a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, MCM 610 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

Furthermore, the embodiments of MCM 610 and/or system 600 may include fewer components or additional components. For example, semiconductor substrate 120 (FIG. 1) may be one of multiple substrates in a multi-chip module (such as a multi-chip module in which alternating facing chips that include routing and bridge layers are coupled using optical proximity communication). Furthermore, a wide variety of fabrication techniques may be used to fabricate the MCM in the preceding embodiments of the MCM, as is known to one of skill in the art. For example, instead of flip-chip or wafer bonding, optical gain chip 112 may be monolithically integrated onto a silicon-on-insulator substrate by epitaxial growth or using another fabrication technique. In addition, a wide variety of optical components may be used in or in conjunction with the MCM.

Although these embodiments are illustrated as having a number of discrete items, these optical components, integrated circuits and the system are intended to be functional descriptions of the various features that may be present rather than structural schematics of the embodiments described herein. Consequently, in these embodiments two or more components may be combined into a single component, and/or a position of one or more components may be changed. In addition, functionality in the preceding embodiments of the MCM, MCM 610 and/or system 600 may be implemented more in hardware and less in software, or less in hardware and more in software, as is known in the art.

While the preceding embodiments have been illustrated with particular elements and compounds, a wide variety of materials and compositions (including stoichiometric and non-stoichiometric compositions) may be used, as is known to one of skill in the art. Thus, while a silicon optical waveguide was illustrated in the preceding embodiments, the packaging technique may be used with other materials (such as germanium and/or silicon germanium), as is known to one of skill in the art. Moreover, semiconductor layer 124 (FIG. 1) may include polysilicon or amorphous silicon. Furthermore, the materials and compounds in MCM 610 may be fabricated using a wide variety of processing techniques, including: evaporation, sputtering, chemical vapor deposition, molecular-beam epitaxy, wet or dry etching (such as photolithography or direct-write lithography), polishing, etc. In addition, a wide variety of optical components may be used in or in conjunction with the optical device and/or MCM 610.

Note that components in MCM 610 may be defined using an additive process (i.e., material deposition) and/or a subtractive process (i.e., material removal). For example, the process may include: sputtering, isotropic etching, anisotropic etching, a photolithographic technique and/or a direct-write technique. Additionally, these features may be fabricated using a wide variety of materials, including: a semiconductor, metal, glass, sapphire, silicon dioxide, organic materials, inorganic materials, a resin and/or polymers.

In general, MCM 610 may include an array of chip modules (CMs) or single-chip modules (SCMs), and a given SCM may include at least one substrate, such as a semiconductor die. Note that an MCM is sometimes referred to as a 'macrochip.' Furthermore, the substrate may communicate with other substrates, CMs and/or SCMs in MCM 610 using proximity communication of electromagnetically coupled signals (which is referred to as 'electromagnetic proximity communication'). For example, the proximity communication may include: communication of capacitively coupled signals ('electrical proximity communication') and/or communication of optical signals (such as 'optical proximity communication'). In some embodiments, the electromagnetic proximity communication includes inductively coupled signals and/or conductively coupled signals.

Figure 7:
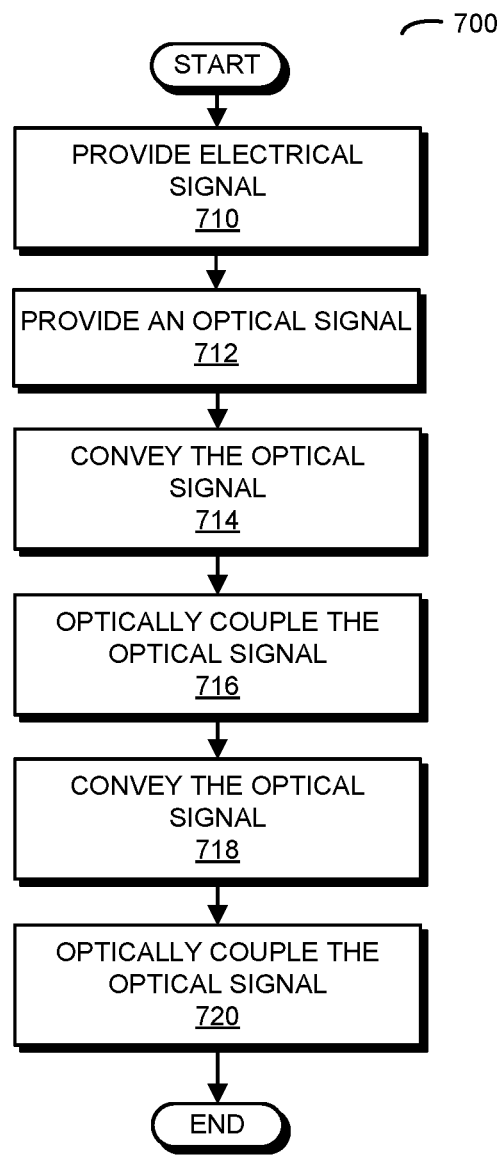
FIG. 7 is a flow chart illustrating a method for outputting an optical signal in accordance with an embodiment of the present disclosure.

We now describe embodiments of a method for generating optical signals. FIG. 7 presents a flow chart illustrating a method 700 for outputting an optical signal using an MCM, such as one of the preceding embodiments of the MCM. During operation, the MCM provides an electrical signal (operation 710) from an interposer to an optical gain chip, where the optical gain chip includes a substrate. Then, the MCM provides, based on the electrical signal, an optical signal (operation 712) from the optical gain chip to a photonic chip, where the photonic chip is electrically coupled to the interposer, and the photonic chip includes: a second substrate; a buried-oxide (BOX) layer disposed on the second substrate; and a semiconductor layer disposed on the buried-oxide layer.

Moreover, the MCM conveys the optical signal (operation 714) in an optical waveguide in the photonic chip. Furthermore, the MCM optically couples the optical signal (operation 716) from the optical waveguide to a second optical waveguide at a first end of a waveguide-fiber connector, where the waveguide-fiber connector is mechanically coupled to the interposer.

Additionally, the MCM conveys, via the second optical waveguide, the optical signal (operation 718) from a vertical location of the optical waveguide relative to a top surface of the interposer to a vertical location of an optical fiber in an optical fiber coupler, and optically couples the optical signal (operation 720) from the second optical waveguide to the optical fiber.

In some embodiments of method 700, there may be additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A multi-chip module (MCM), comprising:
an interposer having a top surface; and
a photonic chip, wherein the photonic chip includes:
  a substrate;
  a buried-oxide (BOX) layer disposed on the substrate; and
  a semiconductor layer disposed on the buried-oxide layer, wherein an optical waveguide is defined in the BOX layer and the semiconductor layer, and
wherein traces, disposed on the semiconductor layer, face and are electrically coupled to the top surface of the interposer,
an optical gain chip, wherein the optical gain chip includes a second substrate,
wherein a second optical waveguide is defined in the second substrate,
wherein a location of the second optical waveguide is vertically aligned with a location of the optical waveguide relative to the top surface of the interposer, and
wherein the second substrate faces and is electrically coupled to the top surface of the interposer; and
a waveguide-fiber connector, mechanically coupled to the top surface of the interposer, having a first end configured to remateably mechanically couple to an optical fiber coupler and a second end, wherein the waveguide-fiber connector includes a third optical waveguide that optically couples the first end and the second end,
wherein, at the second end, a location of the third optical waveguide is vertically aligned with a location of the optical waveguide relative to the top surface of the interposer;
wherein the optical fiber coupler is located at a first vertical position relative to the top surface of the interposer and the optical waveguide is located at a second, different vertical position relative to the top surface of the interposer, and
wherein the third optical waveguide has a three-dimensional form that, during operation, conveys an optical signal between the first vertical position and the second vertical position.

2. The MCM of claim 1, wherein the optical fiber coupler includes an optical fiber; and
wherein, at the first end, a location of the third optical waveguide is vertically aligned with a location of an optical fiber included in the optical fiber coupler.

3. The MCM of claim 2, wherein the waveguide-fiber connector includes a ferrule for the optical fiber in the optical fiber coupler.

4. The MCM of claim 1, wherein the waveguide-fiber connector includes a material compatible with a reflow temperature exceeding a predefined threshold.

5. The MCM of claim 1, wherein the waveguide-fiber connector includes mechanical alignment features configured to mate with corresponding mechanical alignment features in the optical fiber coupler.

6. The MCM of claim 1, wherein the optical gain chip includes an optical spot-size converter that, during operation, transitions a spot size of an optical mode in the optical waveguide to a second spot size of a second optical mode in the second optical waveguide.

7. The MCM of claim 1, wherein the second substrate includes a semiconductor other than silicon.

8. The MCM of claim 1, wherein the second substrate includes a III-V compound semiconductor.

9. The MCM of claim 1, wherein the optical gain chip is one of: a semiconductor optical amplifier; and a laser.

10. The MCM of claim 1, wherein the substrate, the BOX layer and the semiconductor layer constitute a silicon-on-insulator technology.

11. A system, comprising:
a processor;
a memory, coupled to the processor, which stores a program module, and which, during operation, is executed by the processor; and
an MCM, wherein the MCM includes:
an interposer having a top surface; and
a photonic chip, wherein the photonic chip includes:
  a substrate;

a buried-oxide (BOX) layer disposed on the substrate; and a semiconductor layer disposed on the buried-oxide layer, wherein an optical waveguide is defined in the BOX layer and the semiconductor layer, and wherein traces, disposed on the semiconductor layer, face and are electrically coupled to the top surface of the interposer;

an optical gain chip, wherein the optical gain chip includes a second substrate, wherein a second optical waveguide is defined in the second substrate, wherein a location of the second optical waveguide is vertically aligned with a location of the optical waveguide relative to the top surface of the interposer, and wherein the second substrate faces and is electrically coupled to the top surface of the interposer;

a waveguide-fiber connector, mechanically coupled to the top surface of the interposer, having a first end configured to remateably mechanically couple to an optical fiber coupler and a second end, wherein the waveguide-fiber connector includes a third optical waveguide that optically couples the first end and the second end, and wherein, at the second end, a location of the third optical waveguide is vertically aligned with a location of the optical waveguide relative to the top surface of the interposer;

wherein the optical fiber coupler is located at a first vertical position relative to the top surface of the interposer and the optical waveguide is located at a second, different vertical position relative to the top surface of the interposer, and wherein the third optical waveguide has a three-dimensional form that, during operation, conveys an optical signal between the first vertical position and the second vertical position.

12. The system of claim 11, wherein the optical fiber coupler includes an optical fiber; and wherein, at the first end, a location of the third optical waveguide is vertically aligned with a location of an optical fiber included in the optical fiber coupler.

13. The system of claim 11, wherein the waveguide-fiber connector includes a material compatible with a reflow temperature exceeding a predefined threshold.

14. The system of claim 11, wherein the waveguide-fiber connector includes mechanical alignment features configured to mate with corresponding mechanical alignment features in the optical fiber coupler.

15. The system of claim 11, wherein the optical gain chip includes an optical spot-size converter that, during operation, transitions a spot size of an optical mode in the optical waveguide to a second spot size of a second optical mode in the second optical waveguide.

16. The system of claim 11, wherein the second substrate includes a semiconductor other than silicon.

17. The system of claim 11, wherein the substrate, the BOX layer and the semiconductor layer constitute a silicon-on-insulator technology.

18. A method for outputting an optical signal, comprising:
providing an electrical signal from an interposer to an optical gain chip, wherein the optical gain chip includes a substrate;

providing, based on the electrical signal, an optical signal from the optical gain chip to a photonic chip, wherein the photonic chip is electrically coupled to the interposer, and wherein the photonic chip includes: a second substrate; a buried-oxide (BOX) layer disposed on the second substrate; and a semiconductor layer disposed on the buried-oxide layer;

conveying the optical signal in an optical waveguide in the photonic chip;

optically coupling the optical signal from the optical waveguide to a second optical waveguide at a first end of a waveguide-fiber connector, wherein the waveguide-fiber connector is mechanically coupled to the interposer;

conveying, via the second optical waveguide, the optical signal from a vertical location of the optical waveguide relative to a top surface of the interposer to a vertical location of an optical fiber in an optical fiber coupler, wherein the vertical location of the optical waveguide is different than the vertical location of the optical fiber, and wherein the wherein the second optical waveguide has a three-dimensional form; and optically coupling the optical signal from the second optical waveguide to the optical fiber.

* * * * *

UNITED STATES PATENT AND TRADEMARK OFFICE
CERTIFICATE OF CORRECTION

PATENT NO.       : 9,698,564 B1
APPLICATION NO.  : 15/019631
DATED            : July 4, 2017
INVENTOR(S)      : Shubin et al.

It is certified that error appears in the above-identified patent and that said Letters Patent is hereby corrected as shown below:

On the Title Page

Item (54) and in the Specification, Column 1, Line 1, under Title, delete "HYBRID INTEGRATED" and insert -- HYBRID-INTEGRATED --, therefor.

In the Claims

In Column 11, Line 67, in Claim 1, delete "interposer," and insert -- interposer; --, therefor.

In Column 12, Line 25, in Claim 1, delete "interposer," and insert -- interposer; --, therefor.

In Column 13, Line 32, in Claim 11, delete "interposer," and insert -- interposer; --, therefor.

In Column 14, Line 39, in Claim 18, delete "wherein the wherein the" and insert -- wherein the --, therefor.

Signed and Sealed this
Twentieth Day of February, 2018

Andrei Iancu
*Director of the United States Patent and Trademark Office*